United States Patent [19]

Oprosky et al.

[11] Patent Number: 5,417,745
[45] Date of Patent: May 23, 1995

[54] SILVER CONTAINING CONDUCTIVE COATINGS

[75] Inventors: Joanna Oprosky, Canonsburg; David Stotka, Washington, both of Pa.

[73] Assignee: Cerdec Corporation, Washington, Pa.

[21] Appl. No.: 240,489

[22] Filed: May 10, 1994

Related U.S. Application Data

[62] Division of Ser. No. 113,666, Aug. 31, 1993, Pat. No. 5,346,651.

[51] Int. Cl.$^6$ ................................. C03C 8/18
[52] U.S. Cl. ................................. 106/13; 106/1.14; 252/514; 428/428; 296/84.1
[58] Field of Search ............... 501/19, 20, 26, 36; 106/1.14, 13; 252/514; 428/428; 296/84.1

[56] References Cited

U.S. PATENT DOCUMENTS

| | | | |
|---|---|---|---|
| 4,029,605 | 6/1977 | Kosiorek | 252/514 |
| 4,369,063 | 1/1983 | McGowan, Jr. | 106/1.14 |
| 4,547,467 | 10/1985 | Barth et al. | 501/20 |
| 4,959,090 | 9/1990 | Reinherz | 65/60.4 |
| 4,975,301 | 12/1990 | Andrews et al. | 427/126.2 |
| 4,983,196 | 1/1991 | Stotka | 65/24 |

*Primary Examiner*—David Brunsman
*Attorney, Agent, or Firm*—Wenderoth, Lind & Ponack

[57] ABSTRACT

Silver-containing conductive coatings are provided. The coatings are prepared from compositions comprising silver particulate material, a low firing lead-free glass frit and a liquid organic vehicle. The composition is coated on a substrate and fired to fuse the silver-containing conductive coating to the substrate. The coatings find particular use in the field of automotive backlights. The coatings are of special value in eliminating solder wet through migration.

6 Claims, No Drawings

SILVER CONTAINING CONDUCTIVE COATINGS

This application is a division of application Ser. No. 08/113,666, filed Aug. 31, 1993, now U.S. Pat. No. 5,346,651.

The present invention provides novel silver-containing conductive coatings and a method for applying such coatings to a glass substrate.

BACKGROUND OF THE INVENTION

Silver-containing conductive coatings are generally known in the art. Attention in this respect is directed to U.S. Pat. No. 4,369,063 to McGowan, Jr.; U.S. Pat. No. 4,029,605 to Kosiorek; and U.S. Pat. No. 4,9765,301 to Andrews et al.

Such coatings are useful for various purposes such as heating elements, printed circuits and the like. They can be used as defrost elements for automobile rear windows, as heating elements for warming trays, as conductive elements for touch panels, in printed circuits for electronic applications, and for the manufacture of electronic components such as resistors and capacitors.

One of the principal uses for these coatings is as defrost circuits for automobile backlights (rear windows). Conventional silver-containing conductive coatings for such use generally consist of a particulate silver in a glass frit system. This conventional silver and glass system may contain various elements as modifiers to enhance properties such as bond strength, solderability and abrasion resistance. Sulfur-containing compounds, such as silver sulfate, copper sulfate, silver sulfide, etc., are frequently added in order to "stain" the glass substrate when the compositions are applied. Thus, they create a dark appearance when viewing the applied coating through the glass. These compositions are also dispersed in a vehicle suitable for the intended area of application. For example, pine oil-based vehicles are frequently utilized for screen printing applications.

The method of application of the compositions to the glass substrate is conventional and typically includes well-known techniques such as spraying, brushing, dipping, bonding or screen or stencil printing.

Following application of the composition to the substrate in the desired pattern or design, the coating is optionally dried and fired. The firing fuses the frit and effects a firm bond between the coating and the substrate.

When using such coatings in automotive backlights, after the conductive coating has been sufficiently fused to the glass substrate by means of the high temperature firing, electrical connectors, either tabs or wire mesh braids, are soldered to the surface of the conductive coating to complete the electrical connection to the power source. A problem is encountered in conventional conductive coatings in that solder wet through migration occurs. This causes an undesirable appearance of a "wet spot" where the solder was applied to the conductive coating. This "wet spot" can be seen when viewing the conductive coating from the opposite side of the glass substrate (viewing through the glass). The present invention provides conductive coatings which eliminate this solder wet through migration problem.

The silver-containing conductive coating compositions which are now practically used in the industry employ leadcontaining glass frits. The lead content of these compositions creates certain environmental problems. The compositions of the present invention are lead-free and thus avoid these environmental problems while retaining or even exceeding the solder adhesion strength and abrasion resistance of these conventionally employed lead-containing coatings.

It is known that the content of glass frit in silver-containing conductive coatings has a profound effect on the desirable properties of such coatings such as adhesion to the substrate, solderability and resistivity. A low content of frit provides maximum solderability properties and as the content of frit increases, the solderability decreases. On the other hand, however, at low frit content the coating adhesion to the substrate is minimal and increases as the frit content increases. Resistivity of the coating is high at lower frit content and decreases to a minimal value as frit content increases. At a certain frit concentration, the resistivity reverses and begins to again increase as frit content increases.

For a given glass frit it is thus necessary to adjust the frit content of the composition so that the above properties are all maintained within acceptable values. In the case of conventionally employed lead-containing glass frits, it is necessary to adjust the frit content to relatively low values in order to maintain all of the adhesion, solderability and resistivity values within acceptable parameters. In view of the differences in density between the lead-free glass frits employed in the present invention when compared to the lead-containing frits, it is, however, possible to increase the glass frit content in the compositions of the invention to higher amounts while maintaining acceptable values for all of these properties. This higher glass frit content is theorized to account for the ability to overcome the solder wet through migration problem. Further, the higher frit content is believed to achieve enhanced color characteristics for the fired conductive coatings and also to improve conductivity characteristics.

OBJECTS OF THE INVENTION

It is an object of the invention to provide novel silver-containing conductive coating compositions.

It is a further object to provide a method for using such novel compositions as conductive coatings on automotive backlights.

It is a further object to provide such conductive coating compositions which are lead-free.

A further object is to provide compositions which when applied to glass substrates and fired form the novel silver-containing conductive coatings of the invention.

It is also an object of the invention to provide glass substrates containing a silver conductive coating of the invention fused thereto.

DETAILED DESCRIPTION OF THE INVENTION

In a first embodiment, the invention provides silver-containing conductive coating compositions which are based upon a lead-free glass frit system. These compositions generally comprise a specified silver particulate material, a specified lead-free glass frit and an organic vehicle. The compositions also optionally contain additional components such as staining agents, staining modifiers, rheology modifiers and the like.

As the silver particulate material the compositions employ silver powders, silver flakes or a mixture thereof.

The silver powders are usually chemically precipitated silver powders that consist of loose agglomerates of amorphous particles in various agglomerate size distributions. The powders have the following recommended physical properties:

Tap Density 0.5–4.90 g/cc, preferably 1.25–3.70 g/cc
Surface Area 0.1–1.17 m$^2$g, preferably 0.3–0.85 m$^2$/g
Apparent Density: 10.0–38.0 g/in$^3$, preferably 22.0–35.0 g/in$^3$ Particle Size>99% through 325 mesh.

The silver flakes are usually chemically precipitated silver powders that have been mechanically flattened (usually by some form of impact process such as ball milling) to achieve desired physical properties. The flakes have the following recommended physical properties:

Tap Density: 1.60–4.90 g/cc, preferably 2.0–2.7 g/cc
Surface Area: 0.15–1.20 m$^2$/g, preferably 0.3–0.8 m$^2$/g
Apparent Density: 15.0–44.0 g/in$^3$, preferably 27.0–42.0 g/in$^3$ Particle Size>99% through 325 mesh.

When mixtures of the powders and flakes are employed, the weight ratio of the silver powders to silver flakes employed is generally in the range of about 5:1 to about 1:5. The ratio can be adjusted to achieve the properties desired in the final coating, e.g., the desired adhesion properties to the substrate.

The compositions are formulated to contain from about 40.0% up to about 90.0% by weight of the silver particulate material. The preferred range being about 45.0% to about 85.0% by weight.

Lead-free glass frits are, of course, known in the art and such lead-free frits have previously been employed in formulating silver-containing conductive coatings. See Kosiorek, U.S. Pat. No. 4,029,605. In order, however, to achieve the particular advantages of the present invention, it is essential to employ glass frits of the composition specified herein.

The glass frits employed herein are disclosed in co-pending application Serial No. 08/113,657 of Joseph W. Ryan, filed concurrently herewith.

The glass frits to be employed are low firing (in the range of 604° C. to 621° C.), low density glass frits prepared in the following described manner.

The starting materials used to make the glass frits are as follows:

| MATERIAL | WEIGHT % | PREFERRED |
| --- | --- | --- |
| Zinc Oxide (ZnO) | 13–16 | 14.6 |
| Silica (SiO$_2$) | 17–21 | 19.6 |
| Zircon Flour (ZrSiO$_4$) | 3.5–4.5 | 4.0 |
| Anhydrous Borax (Na$_2$B$_4$O$_7$) | 9–11 | 9.9 |
| Sodium Nitrate (NaNo$_3$) | 3.5–4.5 | 4.0 |
| Bismuth Trioxide (Bi$_2$O$_3$) | 35–45 | 39.4 |
| Boric Acid (H$_3$BO$_3$) | 6.5–8 | 7.2 |
| Titanium Dioxide (TiO$_2$) | 1.3–1.7 | 1.5. |

The starting materials are thoroughly blended and melted at a temperature of 1200°–1300° C. for about forty minutes. The molten glass formed is then water quenched in the known manner to form a frit.

The frit is then ground using conventional milling techniques to form a fine powder.

The composition of the glass frit is as follows:

| Oxide | Weight Percentage Range |
| --- | --- |
| SiO$_2$ | 18.0–25.0 |
| B$_2$O$_3$ | 7.5–12.5 |
| TiO$_2$ | 1.0–2.5 |
| Al$_2$O$_3$* | 0–1.0 |
| ZrO$_2$ | 2.4–3.5 |
| ZnO | 13.0–18.0 |
| Na$_2$O | 3.0–6.0 |
| Bi$_2$O$_3$ | 35.0–46.0. |

*Al$_2$O$_3$ may be introduced into the frit from refractories during the production of the frit.

Glass frits of this composition have been found to have a sufficiently low firing temperature to insure adequate adhesion of the conductive coatings of the invention to the glass substrate. The low firing temperature, low density frit also aids, along with the particulate silver component in resisting the solder wet through migration as discussed above.

The lead-free glass frit is employed in an amount of from about 4% to about 12% by weight of the composition. The preferred range is from about 5% to about 8% by weight.

The organic vehicle employed is generally a liquid vehicle and functions to form a dispersion of the silver particulate material and the glass frit material and to permit the easy application of the composition to the substrate. The nature of the vehicle will affect the desired rheology characteristics of the composition. For purposes of screen printing, viscosities ranging from about 10,000 to 80,000, and preferably from 35,000 to 65,000 centipoises at 20° C. as determined on a Brookfield RVT model Viscometer, #7 spindle at 20 rpm are appropriate.

The vehicle should be inert to the other components of the composition and to the substrate to which the composition is applied. It should not, of course, interfere with the formation of the silver film during firing. Many such liquid vehicles are known in the art. Particularly suitable are vehicles which are based on pine oil, turpentine, mineral oils, glycols, clean burning heavy bodied oils and the like. The method of application and the desired thickness of the coating to be applied will influence the amount and specific composition of the liquid vehicle.

Examples of vehicles which can be employed are disclosed in U.S. Pat. No. 4,369,063.

The organic vehicle comprises generally about 7% to about 40% by weight of the composition, the preferred range being from about 10% to about 31% by weight.

Optionally, additional components may be added to the composition to improve the properties in one way or the other. Such optional components include, but are not limited to the following:

STAINING AGENTS

In addition to the natural color (yellow to amber) that is achieved with the silver coatings during the process of fusing the coating to the glass substrate, there is a desire by users of silver conductive coatings for the product to exhibit a darker color. This is especially the case if the user is going to apply the coating on the atmospheric side of the glass substrate rather than the tin side of the glass, which is normally the case in the current fabrication of automotive glass windows. For this reason, staining agents have been formulated into certain compositions to achieve these desired effects. It is noted that these agents must be added to the formulations within limited amounts to insure that some of the properties of the final coating, such as solder adhesion and electrical resistance, are not impaired. Examples of staining agents which may be employed are selenium, silver chromate, cadmiun oxide pigments, silver phosphate, molybdic oxide, chrome oxide and iron oxide. Such staining agents are generally employed in an amount of from about 0.3% to about 12% by weight of the composition. A preferred range is from about 0.3% to about 7% by weight.

INORGANIC MODIFIERS

Certain inorganic modifiers may also be optionally added. These are incorporated into the formulation to assist in enhancing the physical and mechanical properties of the compositions and the ultimate fired coating. These modifiers help to provide better balance with the silver powders and flakes to optimize the performance of the coating. The properties to be enhanced include viscosity stability, coating theology and applicational properties, color stability during firing, solder adhesion strength, electrical continuity, abrasion and mar resistance, opacity and limit post oxidation of the final coating. Illustrative examples of these Cab-O-Sil (fused silica) supplied by Cabot Corporation
Zinc Oxide
Bismuth Trioxide
Titanium Dioxide
Tin Oxide
Hydrate Alumina Such materials may generally be employed in amounts of from about 0.1% to about 6% by weight, preferably from about 0.1% to about 2.5% by weight of the composition.

The compositions can be prepared by blending the solid materials, adding the liquid components and then thoroughly mixing or kneading to form a smooth, thick paste. The paste is then further dispersed by means of a conventional machine such as a three-roll mill or dispersator such as a Cowles or Morehouse mill.

After formulation the compositions are packaged in sealed containers and are supplied to end users for application, for example, to glass substrates such as automotive backlights. A broad range of compositions can be provided, each having the characteristics desired by the end user. These compositions will vary in silver content, for example ranges of 60 to 80% by weight, may be stained or unstained, and may be characterized as slow, moderate or fast drying. The compositions may thus be "tailored" to the needs of the end user.

The compositions are applied to the glass substrate by techniques such as screen printing, decal application, spraying, brushing, roller coating, and the like. Screen printing is preferred for purposes of application to glass substrates. After application of the composition to the substrate in a desired pattern, the applied coating is then fired to bond the metallic silver to the substrate. The firing temperature will be determined by the frit maturing temperature. The glass frits employed in the present invention have generally low firing temperatures as noted previously herein. In general for automotive backlight application of the compositions of the invention the firing temperature will range from about 604° C. to about 710° C. with the preferred range being about 660° C. to about 704° C.

In cases where more than one application of conductive coating is required, it is possible to dry the first applied coating of the composition, apply the second layer and then fire the total coating. In this way only one firing operation is necessary.

In many cases, the conductive coating will be applied over a ceramic glass enamel. The ceramic glass enamel is commonly used primarily as a UV absorber to protect the adhesive compounds used for mounting the glass to the automobile and also as a decorative device. The glass enamel is applied, then dried or cured if the glass enamel consists of an ultraviolet curable vehicle system, and the conductive coating is applied over the enamel before firing. Compatibility of the two systems is necessary to assure good adhesion and expansion properties.

The resultant fired coating provides a continuous conductor for electrical current firmly adhering to the substrate.

The conductive coatings are applicable in a variety of end uses. Thus, they can be used as defrost elements for automotive backlights, heating elements for warming trays and the like.

The following examples are provided to illustrate the invention. They are illustrative and not exhaustive of the subject matter of the invention. Unless otherwise indicated parts and percentages are by weight.

EXAMPLE 1

This example illustrates the preparation of illustrative silver coating compositions of the present invention.

| SILVER CONDUCTIVE COATING COMPOSITIONS | | | | | | |
|---|---|---|---|---|---|---|
| MATERIAL | A | B | C | D | E | F |
| Ag. Flake #1 | 50% | 20% |  | 30% | 20% | 20% |
| Ag. Flake #2 | 10% | 30% | 29% | 20% | 20% |  |
| Ag. Powder #1 |  | 20% | 40% | 10% | 30% | 30% |
| Ag. Powder #2 |  |  | 10% |  |  | 30% |
| Glass Frit | 8% | 7% | 6.5% | 7% | 6% | 5% |
| Zinc Oxide (modifier) | .5% | .5% | .5% | .5% | .5% | .5% |
| Organic vehicle | 30.5% | 22% | 13.7% | 29.0% | 20.2% | 10.7 |
| Dispersant, Disperbyk 110 |  |  | .3% |  |  | .5% |
| Staining Agent |  |  |  | 2.5% | 3% | 3.5% |
| Cab-O-Sil (modifier) | 1.0% | .5% |  | 1.0% | .3% |  |

| SPECIFIC GRAVITY RANGE (g/cc) | | | | | |
|---|---|---|---|---|---|
| A | B | C | D | E | F |
| 2.20–2.65 | 2.75–3.30 | 3.70–4.30 | 2.10–2.60 | 2.80–3.30 | 4.30–4.80 |

| ANALYTICAL PROPERTIES OF SILVER PARTICULATES | | | | |
|---|---|---|---|---|
|  | Ag Flake #1 | Ag Flake #2 | Ag Powder #1 | Ag Powder #2 |
| % Silver (Chemical Description) | >99.9% | >99.9% | >99.9% | >99.9% |
| Surface Area | 0.60–0.85 | 0.4–0.72 | .28–.56 | .35–.63 |
| Tap Density (m2/gm) | 1.9–2.7 | 3.6–4.2 | 1.9–2.5 | 3.5–4.8 |
| Apparent Density (g/in. 3) | 20–27 | 34–43 | 10–19 | 27–36 |
| Screen Analysis Thru 325 Mesh | >99% | >99% | >99% | >99% |

| GLASS FRIT COMPOSITION | |
|---|---|
| MATERIAL | WEIGHT % |
| $SiO_2$ | 23.1 |
| $B_2O_3$ | 9.0 |
| $TiO_2$ | 1.8 |
| $Al_2O_3$ | 0.5 |
| $ZrO_2$ | 2.7 |
| ZnO | 15.7 |
| $Na_2O$ | 4.9 |

| | -continued | |
|---|---|---|
| | Bi$_2$O$_3$ | 42.3 |
| | | 100.00 |

The compositions were prepared by blending the solid materials, adding the liquid components and then thoroughly kneading to form a smooth, thick paste. The paste was then further dispersed by means of a conventional three-roll mill. The resultant compositions were found to have viscosities suitable for screen printing.

The compositions were then screen printed onto float glass substrates in a grid pattern 59.69 cm in length and 0.0762 cm in width. Typical wet film thickness is between 40–60 microns when using a screen mesh between 160–230. Each coating was then fired at 704° C. for 3.0 minutes to produce a silver conductive coating on the glass substrate with a fired film thickness between 12 and 25 microns.

The resultant silver conductive coatings were found to exhibit desirable electrical characteristics and to have excellent bond strength, solderability and abrasion resistance properties.

Electrical connectors were soldered to each of the coatings and the connection points were viewed through the opposite side of the glass substrate. No wet spot was visible and the coatings were thus deemed satisfactory in preventing solder wet through migration.

We claim:

1. A method for the production of a silver-containing conductive coating on a substrate which comprises
    applying a coating of a composition which comprises
    (a) from about 40% to about 90% by weight of a silver particulate material selected from the group consisting of silver powder, silver flake and mixture thereof,
    (b) from about 4% to about 12% by weight of a low firing lead-free glass frit having the following composition:

| | | |
|---|---|---|
| ZnO | 13–18% | by weight |
| SiO$_2$ | 18.0–25.0% | by weight |
| ZrO$_2$ | 2.4–3.5% | by weight |
| B$_2$O$_3$ | 7.5–12.5% | by weight |
| Na$_2$O | 3.0–6.0% | by weight |
| Bi$_2$O$_3$ | 35.0–46.0% | by weight |
| TiO$_2$ | 1.0–2.5% | by weight |
| Al$_2$O$_3$ | 0–1.0% | by weight | and,
    (c) from about 7% to about 40% by weight of a liquid organic vehicle which functions to form a dispersion of the silver particulate and glass frit materials and permit the easy application of the composition to a substrate,
to a substrate, and firing the substrate containing the said coating to fuse the coating to the substrate.

2. A method according to claim 1 wherein the coating of the composition is applied by screen printing.

3. A method according to claim 1 wherein the substrate is an automotive backlight.

4. A substrate having a silver-containing conductive coating fused thereto prepared according to the method of claim 1.

5. A glass substrate having a silver-containing conductive coating fused thereto prepared according to the method of claim 1.

6. An automotive backlight comprising a glass substrate having a silver-containing conductive coating fused thereto prepared according to the method of claim 1.

* * * * *